(12) United States Patent
Hu et al.

(10) Patent No.: US 10,943,853 B2
(45) Date of Patent: Mar. 9, 2021

(54) SEMICONDUCTOR DEVICE AND MANUFACTURING METHOD THEREOF

(71) Applicant: WUHAN XINXIN SEMICONDUCTOR MANUFACTURING CO., LTD., Hubei (CN)

(72) Inventors: Xing Hu, Hubei (CN); Yu Zhou, Hubei (CN); Tianjian Liu, Hubei (CN); Sheng Hu, Hubei (CN); Changlin Zhao, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 0 days.

(21) Appl. No.: 16/397,066

(22) Filed: Apr. 29, 2019

(65) Prior Publication Data

US 2020/0075460 A1     Mar. 5, 2020

(30) Foreign Application Priority Data

Aug. 28, 2018    (CN) .......................... 201810989687.4

(51) Int. Cl.
*H01L 23/48*    (2006.01)
*H01L 21/311*   (2006.01)
(Continued)

(52) U.S. Cl.
CPC ...... *H01L 23/481* (2013.01); *H01L 21/31116* (2013.01); *H01L 21/76898* (2013.01);
(Continued)

(58) Field of Classification Search
CPC ............... H01L 25/0657; H01L 23/481; H01L 21/76898; H01L 2225/06541;
(Continued)

(56) References Cited

U.S. PATENT DOCUMENTS

2011/0171827 A1    7/2011   Farooq et al.
2015/0348874 A1*  12/2015   Tsai ...................... H01L 23/481
                                                               257/774
(Continued)

FOREIGN PATENT DOCUMENTS

CN     103035615 A    4/2013
CN     104766828 A    7/2015

*Primary Examiner* — Cuong B Nguyen
(74) *Attorney, Agent, or Firm* — Muncy, Geissler, Olds & Lowe, P.C.

(57) ABSTRACT

A semiconductor device and a manufacturing method thereof are disclosed. In the device, the isolation layer is used to prevent the first metal layer and the second metal layer which are over-etched and back-splashed from diffusing to a first substrate; and the isolation layer serves as a barrier layer to prevent an interconnection layer from diffusing into the first substrate. Further, the isolation layer includes a silicon nitride layer, which is advantageous for preventing the metal layers from back-splashing and diffusing to the sidewall of the first substrate. The isolation layer further includes a first silicon oxide layer and a second silicon oxide layer, wherein the second silicon oxide layer is used to protect the silicon nitride layer from being etched and consumed and the first silicon oxide layer is used to improve the adhesion between the silicon nitride layer and the first substrate.

20 Claims, 10 Drawing Sheets

(51) Int. Cl.
*H01L 21/768* (2006.01)
*H01L 23/532* (2006.01)
*H01L 23/00* (2006.01)

(52) U.S. Cl.
CPC .... *H01L 23/5329* (2013.01); *H01L 23/53228* (2013.01); *H01L 24/32* (2013.01); *H01L 2224/32145* (2013.01)

(58) Field of Classification Search
CPC ........... H01L 21/3116; H01L 23/53228; H01L 23/5329; H01L 24/32; H01L 2224/32145; H01L 25/065; H01L 23/5226; H01L 23/5283; H01L 225/06541; H01L 225/06544; H01L 21/02063; H01L 21/76816; H01L 21/76877–76883; H01L 21/76897; H01L 21/486; H01L 23/5384; H01L 2221/1031; H01L 2221/1036; H01L 2223/6616–6622; H01L 2224/05085–05098; H01L 2224/8203–82047; H01L 21/743
See application file for complete search history.

(56) References Cited

U.S. PATENT DOCUMENTS

2017/0018509 A1\* 1/2017 Puri ................. H01L 21/76229
2017/0062392 A1\* 3/2017 Cheng .................... H01L 25/50

\* cited by examiner

Provide a first wafer and a second wafer that are bonded, wherein the first wafer includes a first substrate, a first dielectric layer located on a front surface of the first substrate and a first metal layer embedded in the first dielectric layer, the second wafer includes a second substrate, a second dielectric layer located on the second substrate and a second metal layer embedded in the second dielectric layer, and the first dielectric layer faces the second dielectric layer Form a first opening and a second opening, wherein the first opening penetrates through the first substrate and a portion of the first dielectric layer and is located above the first metal layer and the second metal layer; the second opening penetrates through the first wafer and a portion of the second dielectric layer and is located above the second metal layer, and the second opening communicates with the first opening Perform a dry etching process to expose the first metal layer and the second metal layer and form a third opening, wherein the third opening is located between the first opening and the second opening and communicates with the first opening and the second opening, a cross section width of the third opening is greater than a cross section width of the second opening and less than a cross section width of the first opening, and the third opening exposes the first metal layer Form an interconnection layer, wherein the interconnection layer is electrically connected to the first metal layer and the second metal layer via the first opening, the third opening and the second opening Form a lead-out layer, wherein the lead-out layer is electrically connected to the interconnection layer Form an isolation layer before performing the dry etching process, the isolation layer covering at least a surface of the first opening, and removing a portion of the isolation layer at the bottom surface of the first opening when performing the dry etching process

SEMICONDUCTOR DEVICE AND MANUFACTURING METHOD THEREOF

CROSS-REFERENCE TO RELATED APPLICATION

This application claims the priority of Chinese patent application number 201810989687.4, filed on Aug. 28, 2018, the entire contents of which are incorporated herein by reference.

TECHNICAL FIELD

The present invention pertains to the technical field of integrated circuit manufacturing, and in particular, relates to a semiconductor device and a manufacturing method thereof.

BACKGROUND

TSV (Through Silicon Via) technology is a new technology for interconnecting chips by fabricating vertical conduction between a chip and a chip and between a wafer and a wafer, which enables a higher stack density in three dimensions.

TSV technology often adopts a TSV nested hole structure formed by a combination of three longitudinally communicating openings. The TSV nested hole is respectively connected to the metal layers of the two wafers to realize interconnection, and the TSV nested hole structure can largely satisfy the requirements of the metal interconnection after bonding.

However, the inventors have found that the limitations of this TSV nested hole structure in practical applications are also becoming increasingly prominent. Specifically, the first opening penetrates through the first substrate of the first wafer and is located above the metal layers of the two wafers, and the second opening is located above the second metal layer of the second wafer. In the process of performing dry etching to expose the first metal layer and the second metal layer, if a certain degree of over-etching is not performed, the first metal layer and the second metal layer are easily exposed insufficiently, but if over-etching is performed, it is easy for metal to be splashed back to the first substrate, thereby causing metal diffusion to contaminate the first wafer.

SUMMARY OF THE INVENTION

An objective of the present invention is to solve the problem of metal diffusion to contaminate a wafer.

In order to solve the above technical problem, the present invention provides a semiconductor device, including:

a first wafer and a second wafer, wherein the first wafer includes a first substrate, a first dielectric layer located on a front surface of the first substrate and a first metal layer embedded in the first dielectric layer, the second wafer includes a second substrate, a second dielectric layer located on a front surface of the second substrate and a second metal layer embedded in the second dielectric layer, and the first dielectric layer and the second dielectric layer being bonded to each other;

a first opening, wherein the first opening penetrates through the first substrate and a portion of the first dielectric layer, and the first opening located above the first metal layer;

a second opening, wherein the second opening penetrates through a portion of the second dielectric layer and is located above the second metal layer, and the second opening communicating with the first opening;

an isolation layer, wherein the isolation layer covers at least a side surface of the first opening;

a third opening, wherein the third opening is located between the first opening and the second opening and communicates with the first opening and the second opening, the third opening having a cross section width greater than a cross section width of the second opening and smaller than a cross section width of the first opening, and the third opening exposing the first metal layer;

an interconnection layer, wherein the interconnection layer is electrically connected to the first metal layer and the second metal layer via the first opening, the second opening and the third opening; and a lead-out layer, wherein the lead-out layer is electrically connected to the interconnection layer.

Further, the isolation layer further includes a first silicon oxide layer, the first silicon oxide layer covering at least a side surface of the first opening.

Further, the isolation layer further includes a silicon nitride layer, the silicon nitride layer covering the first silicon oxide layer.

Further, the isolation layer further includes a second silicon oxide layer, the second silicon oxide layer covering the silicon nitride layer.

Further, the material of the first metal layer and the second metal layer is copper or a copper alloy.

Further, the isolation layer is further located on a side surface of the second opening.

Further, the isolation layer further covers a back surface of the first substrate.

Further, the back surface of the first substrate is further provided with a passivation layer, and the isolation layer further covering the passivation layer.

Further, the first dielectric layer includes a first dielectric layer first portion and a first dielectric layer second portion.

Further, the second dielectric layer includes a second dielectric layer first portion and a second dielectric layer second portion.

The present invention further provides a manufacturing method of the semiconductor device, including:

providing a first wafer and a second wafer, wherein the first wafer includes a first substrate, a first dielectric layer located on a front surface of the first substrate and a first metal layer embedded in the first dielectric layer, the second wafer includes a second substrate, a second dielectric layer located on the second substrate and a second metal layer embedded in the second dielectric layer, and the first dielectric layer and the second dielectric layer being bonded to each other;

forming a first opening and a second opening, wherein the first opening penetrates through the first substrate and a portion of the first dielectric layer and is located above the first metal layer; the second opening penetrates through a portion of the second dielectric layer and is located above the second metal layer, and the second opening communicating with the first opening;

performing a dry etching process to expose the first metal layer and the second metal layer and form a third opening, wherein the third opening is located between the first opening and the second opening and communicates with the first opening and the second opening, the third opening having a cross section width greater than a cross section width of the second opening and smaller than a cross section width of the first opening, and the third opening exposing the first metal layer;

forming an interconnection layer, wherein the interconnection layer is electrically connected to the first metal layer and the second metal layer via the first opening, the second opening and the third opening; and forming a lead-out layer, wherein the lead-out layer is electrically connected to the interconnection layer.

The manufacturing method further includes:

forming an isolation layer before performing the dry etching process, the isolation layer covering at least a side surface of the first opening, and removing a portion of the isolation layer at a bottom surface of the first opening when the dry etching process is performed.

The present invention provides a semiconductor device. On the one hand, in the process of dry etching to expose the first metal layer and the second metal layer, the isolation layer prevents the first metal layer and the second metal layer which are over-etched and back-splashed from diffusing to the first substrate; on the other hand, the isolation layer serves as a barrier layer to prevent the interconnection layer from diffusing into the first substrate. Further, the isolation layer includes a silicon nitride layer, and the silicon nitride layer is relatively compact, which is advantageous for preventing the first metal layer and the second metal layer, such as copper, from back-splashing and diffusing to the sidewall of the first substrate. Furthermore, the isolation layer further includes a first silicon oxide layer and a second silicon oxide layer, wherein the second silicon oxide layer is used to protect the silicon nitride layer from being etched and consumed; and the first silicon oxide layer has good compactness and good surface coverage, and is used to improve the adhesion between the silicon nitride layer and the first substrate, and at the same time alleviate the stress of the silicon nitride layer and prevent the possible chip breakage on the wafer due to excessive stress of the silicon nitride layer.

The reference signs are as follows:
10—first wafer;
101—first substrate; 102—first dielectric layer; 103—first metal layer;
20—second wafer;
201—second substrate; 202—second dielectric layer; 203—second metal layer;
41—first opening; 42—second opening; 43—third opening; 80—bonding interface;
30—first wafer;
301—first substrate; 302—first dielectric layer; 302a—first dielectric layer first portion; 302b—first dielectric layer second portion; 303—first metal layer; 304—first etching stopping layer; 305—passivation layer;
306—isolation layer; 306a—first silicon oxide layer; 306b—silicon nitride layer;
306c—second silicon oxide layer;
307—interconnection layer; 308—insulating layer; 309—lead-out layer;
40—second wafer;
401—second substrate; 402—second dielectric layer; 402a—second dielectric layer first portion; 402b—second dielectric layer second portion; 403—second metal layer; 404—second etching stopping layer;
50—bonding interface;
51—first opening; 52—second opening; 53'—third shallow trench; 53—third opening;
60—filling layer; 70—photoresist; 70'—photoresist opening.

DETAILED DESCRIPTION OF EXEMPLARY EMBODIMENTS

As described in the background, the TSV nested hole structure can largely satisfy the requirements of the metal interconnection after bonding. However, the inventors have found that the current TSV nested hole structure has limitations in realizing metal interconnection in practical applications. The reason is that in the process of performing dry etching to expose the first metal layer and the second metal layer, if a certain degree of over-etching is not performed, the first metal layer and the second metal layer are easily exposed insufficiently, but if over-etching is performed, it is easy for metal to be splashed back to the first substrate, thereby causing metal diffusion to contaminate the first wafer.

Figure 1:
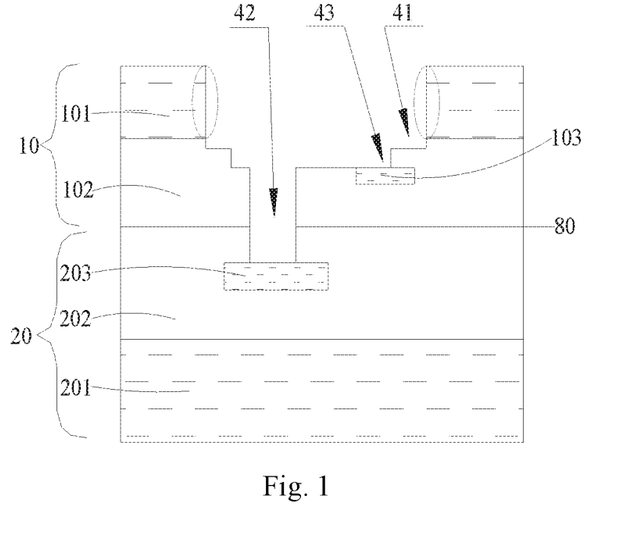
FIG. 1 is a schematic cross-sectional view after a first metal layer and a second metal layer are exposed by a dry etching process in a TSV nested hole structure manufacturing method.

Specifically, as shown in FIG. 1, the first wafer 10 and the second wafer 20 are bonded to each other. The first wafer 10 includes a first substrate 101, a first dielectric layer 102 located on the first substrate 101 and a first metal layer 103 embedded in the first dielectric layer 102. The second wafer 20 includes a second substrate 201, a second dielectric layer 202 located on the second substrate 201 and a second metal layer 203 embedded in the second dielectric layer 202. The first dielectric layer 102 faces the second dielectric layer 202 to form a bonding interface 80. The first opening 41 penetrates through the first substrate 101 and a portion of the first dielectric layer 102 and is located above the first metal layer 103 and the second metal layer 203. The second opening 42 penetrates through the first wafer 10 and a portion of the second dielectric layer 202 and is located above the second metal layer 203. A third opening 43 is formed in the process of exposing the first metal layer 103 by performing a dry etching process.

However, in the process of performing dry etching to expose the first metal layer 103 and the second metal layer 203, if a certain degree of over-etching is not performed, the first metal layer 103 and the second metal layer 203 are easily exposed insufficiently, but if over-etching is performed, the dry etching process uses an electric field to guide and accelerate the plasma. When a high-energy plasma bombards the etched materials on the surfaces of the first metal layer 103 and the second metal layer 203 (i.e., the first dielectric layer 102 and the second dielectric layer 202), the atoms of the etched materials are knocked out to achieve the purpose of etching. In order to be sufficiently exposed, the surfaces of the first metal layer 103 and the second metal layer 203 are also bombarded by the high-energy plasma during the over-etching, and there is a metal back-splashing. The material of the first metal layer 103 and the second metal layer 203 is, for example, copper, such that the back-splashed copper easily diffuses to the sidewall of the first substrate 101 (shown in the circle in the figure), thereby contaminating the first wafer 10.

Based on the above research, an embodiment of the present invention provides a semiconductor device and a manufacturing method thereof. The present invention will be further described in detail below with reference to the drawings and specific embodiments. Advantages and features of the present invention will become more apparent from the description. It should be noted that the drawings are in a very simplified form and are used in a non-precise scale, and are merely for convenience and clarity of the purpose of the embodiments of the present invention.

Figure 2:
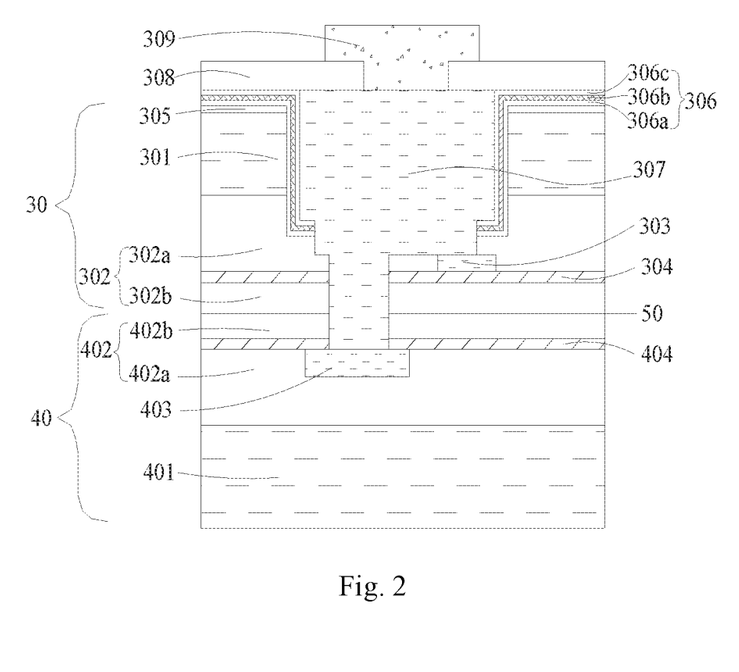
FIG. 2 is a schematic cross-sectional view a semiconductor device in which an isolation layer covers a first opening according to an embodiment of the present invention.
Figure 15:
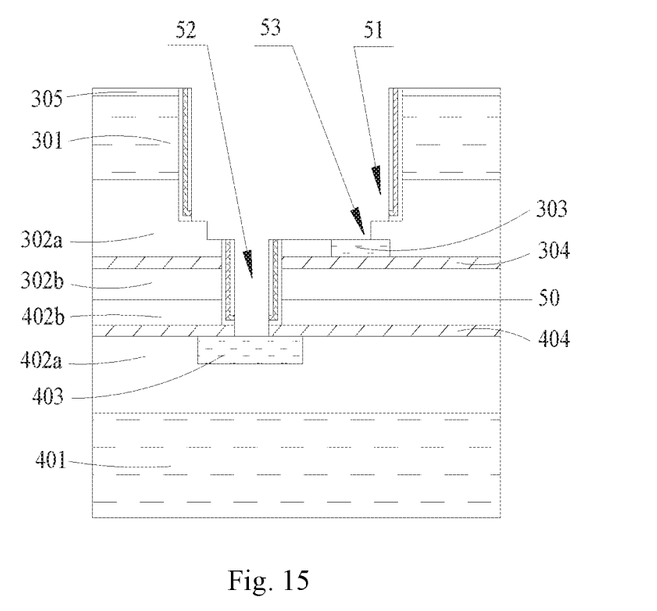
FIG. 15 is a schematic cross-sectional view after the first metal layer and the second metal layer are exposed according to an embodiment of the present invention.

The embodiment of the present invention provides a semiconductor device, as shown in FIG. 2 and FIG. 15, including:

a first wafer 30 and a second wafer 40, wherein the first wafer 30 includes a first substrate 301, a first dielectric layer 302 located on a front surface of the first substrate 301 and a first metal layer 303 embedded in the first dielectric layer 302. The second wafer 40 includes a second substrate 401, a second dielectric layer 402 located on a front surface of the second substrate 401 and a second metal layer 403 embedded in the second dielectric layer 402. The first dielectric layer 302 faces the second dielectric layer 402;

a first opening 51, wherein the first opening 51 penetrates through the first substrate 301 and a portion of the first dielectric layer 302, and the first opening 51 is located above the first metal layer 303 and the second metal layer 403;

a second opening 52, wherein the second opening 52 penetrates through the first wafer 30 and a portion of the second dielectric layer 402 and is located above the second metal layer 403, and the second opening 52 communicates with the first opening 51;

an isolation layer 306, wherein the isolation layer 306 covers at least a side surface of the first opening 51, and the isolation layer 306 includes a silicon nitride layer 306b;

a third opening 53, wherein the third opening 53 is located between the first opening 51 and the second opening 52 and communicates with the first opening 51 and the second opening 52, a cross section width of the third opening 53 is greater than a cross section width of the second opening 52 and smaller than a cross section width of the first opening 51, and the third opening 53 exposes the first metal layer 303;

an interconnection layer 307, wherein the interconnection layer 307 is electrically connected to the first metal layer 303 and the second metal layer 403 via the first opening 51, the third opening 53 and the second opening 52; and a lead-out layer 309, wherein the lead-out layer 309 is electrically connected to the interconnection layer 307.

Further, the material of the first metal layer 303 and the second metal layer 403 is copper or a copper alloy.

Further, the isolation layer 306 further includes a first silicon oxide layer 306a, the first silicon oxide layer 306a covering at least a side surface of the first opening 51, the silicon nitride layer 306b covering the first silicon oxide layer 306a.

Furthermore, the isolation layer 306 further includes a second silicon oxide layer 306c, the second silicon oxide layer 306c covering the silicon nitride layer 306b.

The second silicon oxide layer 306c serves as a main isolation function, and serves as a protective layer for subsequent dry etching to protect the silicon nitride layer 306b from being etched and consumed. The silicon nitride layer 306b serves as an isolation layer to prevent the first metal layer 303 and the second metal layer 403, such as copper, from diffusing to the sidewall of the first substrate 301 after splashing, thereby affecting the performance of the first wafer 30. The first silicon oxide layer 306a has good compactness and good surface coverage, and is used to improve the adhesion between the silicon nitride layer 306b and the first substrate 301. At the same time alleviate the stress of the silicon nitride layer 306b and prevent the possible chip breakage on the wafer due to excessive stress of the silicon nitride layer 306b.

Further, the interconnection layer 307 is a conductive material, which may be copper or a copper alloy, and may be formed by filling by an electroplating process. Here, the isolation layer 306 serves as a barrier layer to prevent the interconnection layer 307 from diffusing into the first substrate 301.

Preferably, the lead-out layer 309 may be an aluminum layer.

Preferably, the back surface of the first substrate 301 is further provided with a passivation layer 305, and the isolation layer 306 further covers the surface of the passivation layer 305.

Figure 3:
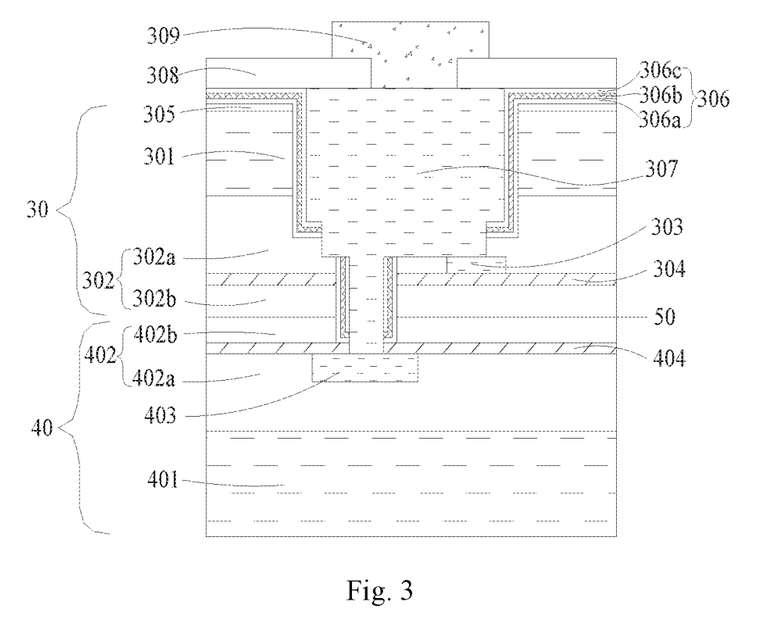
FIG. 3 is a schematic cross-sectional view of a semiconductor device in which an isolation layer covers a first opening and a second opening according to another embodiment of the present invention.

Preferably, the isolation layer 306 further covers the side surface of the second opening 52, as shown in FIG. 3.

In the semiconductor device provided by the embodiment of the present invention, the isolation layer 306 functions to prevent the first metal layer 303 and the second metal layer 403 (the material is, for example, copper) that are over-etched and back-splashed from diffusing to the first substrate 301 in the process of dry etching to expose the first metal layer 303 and the second metal layer 403. The isolation layer 306 also functions as a barrier layer to prevent the interconnection layer 307 (the material is, for example, copper) from diffusing into the first substrate 301.

Figure 4:
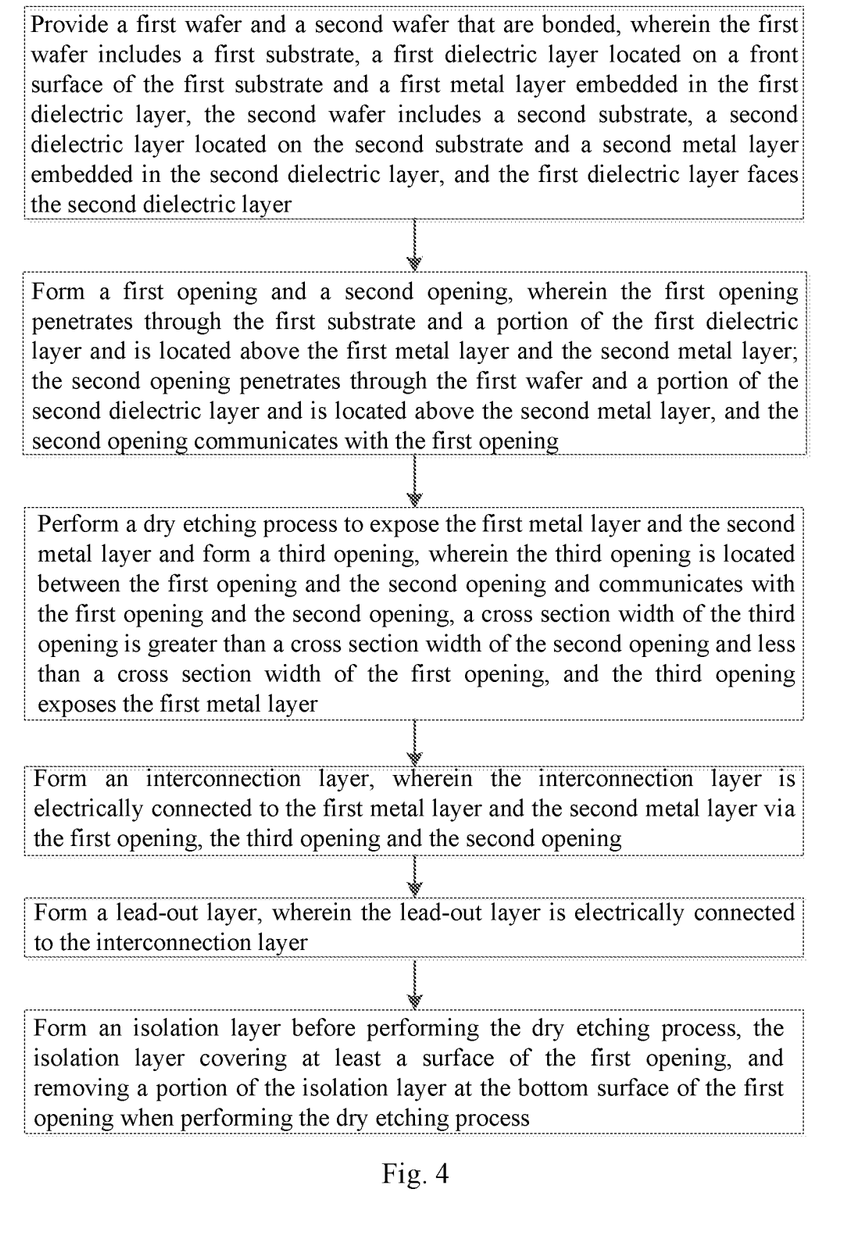
FIG. 4 is a flow diagram of a manufacturing method of a semiconductor device according to an embodiment of the present invention.

The embodiment of the present invention further provides a manufacturing method of the semiconductor device, as shown in FIG. 4, including:

providing a first wafer 30 and a second wafer 40 that are bonded, wherein the first wafer 30 includes a first substrate 301, a first dielectric layer 302 located on a front surface of the first substrate 301 and a first metal layer 303 embedded in the first dielectric layer 302, the second wafer 40 includes a second substrate 401, a second dielectric layer 402 located on the second substrate 401 and a second metal layer 403 embedded in the second dielectric layer 402, and the first dielectric layer 302 faces the second dielectric layer 402;

forming a first opening 51 and a second opening 52, wherein the first opening 51 penetrates through the first substrate 301 and a portion of the first dielectric layer 302 and is located above the first metal layer 303 and the second metal layer 403; the second opening 52 penetrates through the first wafer 10 and a portion of the second dielectric layer 402 and is located above the second metal layer 403, and the second opening 52 communicates with the first opening 51;

performing a dry etching process to expose the first metal layer 303 and the second metal layer 403 and form a third opening 53, wherein the third opening 53 is located between the first opening 51 and the second opening 52 and communicates with the first opening 51 and the second opening 52, a cross section width of the third opening 53 is greater than a cross section width of the second opening 52 and smaller than a cross section width of the first opening 51, and the third opening 53 exposes the first metal layer 303;

forming an interconnection layer 307, wherein the interconnection layer 307 is electrically connected to the first metal layer 303 and the second metal layer 403 via the first opening 51, the third opening 53 and the second opening 52;

forming a lead-out layer 309, wherein the lead-out layer 309 is electrically connected to the interconnection layer 307; The manufacturing method further includes:

forming an isolation layer 306 before performing the dry etching process, the isolation layer 306 covering at least a surface of the first opening 51, and removing a portion of the isolation layer 306 at the bottom surface of the first opening 51 when the dry etching process is performed.

It should be noted that when two wafers are stacked, one wafer is always at the upper portion and the other wafer is at the lower portion, but the present invention does not limit which wafer of the first wafer and the second wafer must be placed above/below, and the positions of the upper and lower wafers can be interchanged. Herein, for the sake of simplicity and convenience of description, only one positional relationship of the two wafers is shown. Those skilled in the art can understand that all the technical contents described herein are also applicable to the case where the positions of the "first wafer" and the "second wafer" are reversed up and down. At this time, the positional relationship of the layers of the stacked semiconductor device is also reversed up and down accordingly. In some cases, preferably, during a bonding process on two wafers, a wafer having a relatively large wafer bow is placed below. However, in this case, after the wafer bonding is completed, it is also possible to determine whether to reverse up and down according to actual needs, thereby ultimately determining which wafer is above and which wafer is below.

It should be understood that the terms "first", "second", "third", "fourth" and the like are used herein to distinguish different components or techniques having the same name, and do not mean a sequence or a positional relationship or the like. In addition, for different components having the same name, such as "first substrate" and "second substrate", "first dielectric layer" and "second dielectric layer", etc., it does not mean that they have the same structure or components. For example, although not shown in the drawings, in most cases, the components formed in the "first substrate" and the "second substrate" are different, and the structures of the substrates may be different. In some implementations, the substrate may be a semiconductor substrate made of any semiconductor material (e.g., Si, SiC, SiGe, etc.) suitable for a semiconductor device. In other implementations, the substrate may also be a composite substrate such as silicon-on-insulator (SOI), silicon germanium-on-insulator, or the like. Those skilled in the art will understand that the substrate is not subject to any restrictions, but may be selected according to practical applications. Various devices (not limited to semiconductor devices) members (not shown) may be formed in the substrate. The substrate may also have been formed with other layers or members, such as gate structures, contact holes, dielectric layers, metal wires, through holes, and the like.

The manufacturing method of the semiconductor device provided by this embodiment is described in detail below with reference to FIG. 3 and FIG. 5 to FIG. 16.

Figure 5:
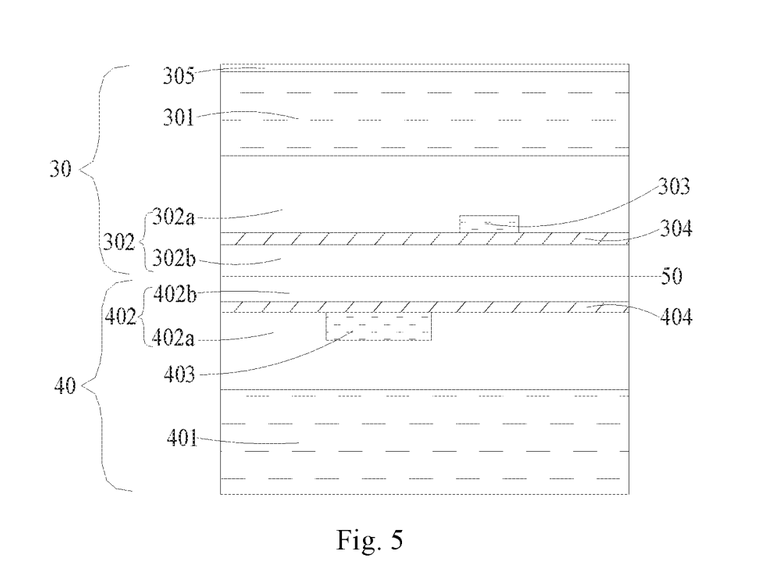
FIG. 5 is a schematic cross-sectional view of a first wafer and a second wafer that are bonded according to an embodiment of the present invention.

As shown in FIG. 5, a first wafer 30 and a second wafer 40 that are bonded are provided. The first wafer 30 includes a first substrate 301, a first dielectric layer 302 located on a front surface of the first substrate 301 and a first metal layer 303 embedded in the first dielectric layer 302. The second wafer 40 includes a second substrate 401, a second dielectric layer 402 located on the second substrate 401 and a second metal layer 403 embedded in the second dielectric layer 402. The first dielectric layer 302 and the second dielectric layer 402 are bonded to each other to form a bonding interface 50.

Preferably, after the two wafers are bonded, the first wafer 30 and/or the second wafer 40 are/is also thinned.

Further, the first dielectric layer 302 includes a first dielectric layer first portion 302a and a first dielectric layer second portion 302b, and the first metal layer 303 is embedded between the first dielectric layer first portion 302a and the first dielectric layer second portion 302b. The second dielectric layer 402 includes a second dielectric layer first portion 402a and a second dielectric layer second portion 402b, and the second metal layer 403 is embedded between the second dielectric layer first portion 402a and the second dielectric layer second portion 402b.

Furthermore, the first wafer 30 further includes a first etching stopping layer 304, and the first etching stopping layer 304 is located between the first metal layer 303 and the first dielectric layer second portion 302b. The second wafer 40 further includes a second etching stopping layer 404, and the second etching stopping layer 404 is located between the second metal layer 403 and the second dielectric layer second portion 402b.

Further, the material of the first metal layer 303 and the second metal layer 403 is, for example, copper or a copper alloy.

Further, the back surface of the first substrate 301 is further provided with a passivation layer 305, and the passivation layer 305, for example, a silicon oxide layer, is used to protect the surface of the first wafer 30.

Figure 6:
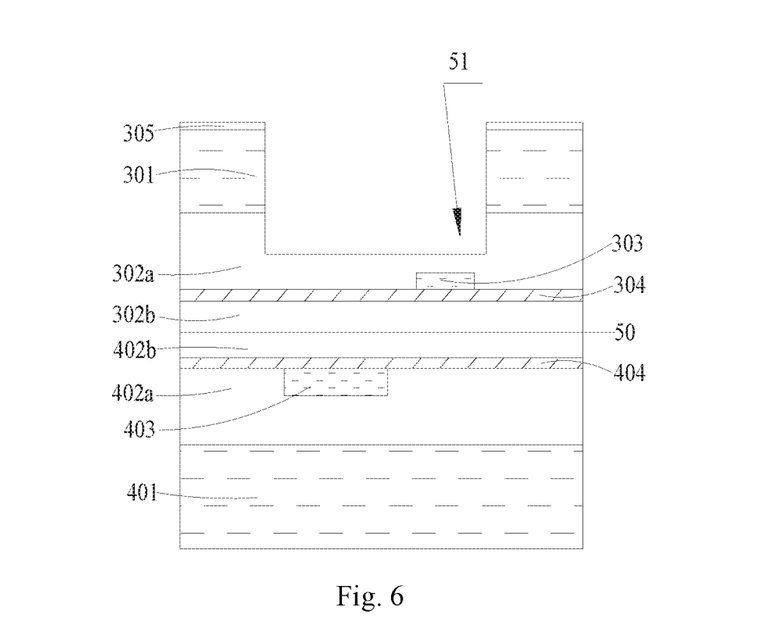
FIG. 6 is a schematic cross-sectional view after a first opening is formed according to an embodiment of the present invention.

Next, as shown in FIG. 6, a first opening 51 is formed. The etching process terminates at the first dielectric layer first portion 302a to form a first opening 51. The first opening 51 penetrates through the first substrate 301 and a portion of the first dielectric layer first portion 302a and is located above the first metal layer 303.

Figure 7:
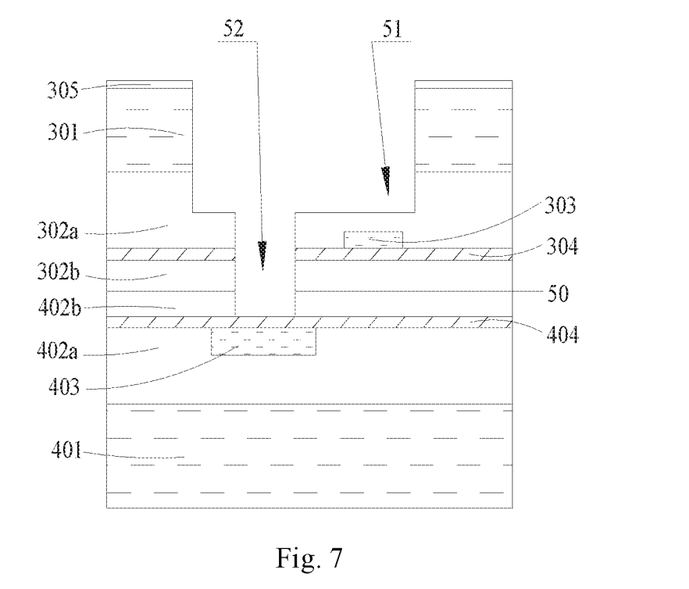
FIG. 7 is a schematic cross-sectional view after a second opening is formed according to an embodiment of the present invention.

Next, as shown in FIG. 7, a second opening 52 is formed. The etching process terminates at the second etching stopping layer 404 to form a second opening 52. The second opening 52 penetrates through the first wafer 30 and the second dielectric layer second portion 402b and is located above the second metal layer 403, and the second opening 52 communicates with the first opening 51.

Figure 8:
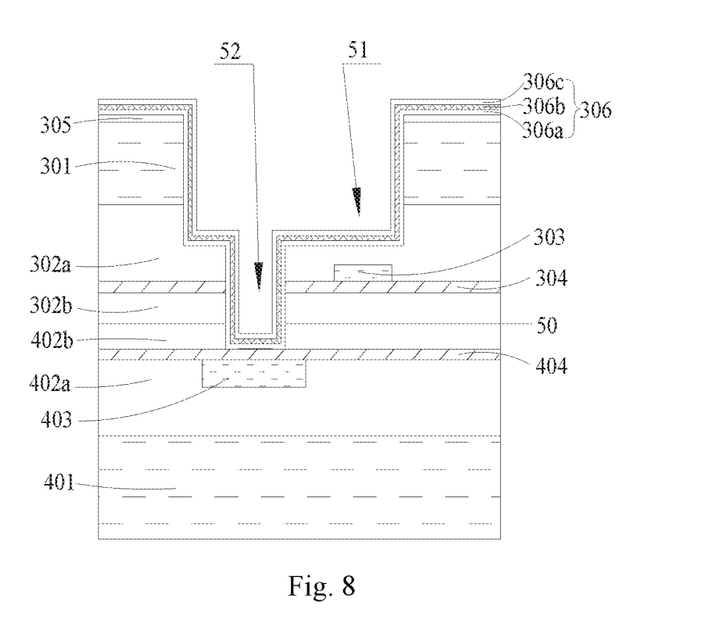
FIG. 8 is a schematic cross-sectional view after an isolation layer is formed according to an embodiment of the present invention.

Next, as shown in FIG. 8, a first silicon oxide layer 306a is formed, wherein the first silicon oxide layer 306a covers the surface of the passivation layer 305, the surface of the first opening 51 and the surface of the second opening 52. A silicon nitride layer 306b is formed, wherein the silicon nitride layer 306b covers the surface of the first silicon oxide layer 306a. A second silicon oxide layer 306c is formed, wherein the second silicon oxide layer 306c covers the surface of the silicon nitride layer 306b. The first silicon oxide layer 306a, the silicon nitride layer 306b and the second silicon oxide layer 306c constitute the isolation layer 306.

The second silicon oxide layer 306c serves as a main isolation function, and serves as a protective layer for subsequent dry etching to protect the silicon nitride layer 306b from being etched and consumed. The silicon nitride layer 306b serves as an isolation layer to prevent the first metal layer 303 and the second metal layer 403, such as copper, from diffusing to the sidewall of the first substrate 301 after splashing, thereby affecting the performance of the first wafer 30. The first silicon oxide layer 306a has good compactness and good surface coverage, and is used to improve the adhesion between the silicon nitride layer 306b and the first substrate 301. And at the same time alleviate the stress of the silicon nitride layer 306b and prevent the possible chip breakage on the wafer due to excessive stress of the silicon nitride layer 306b.

Figure 9:
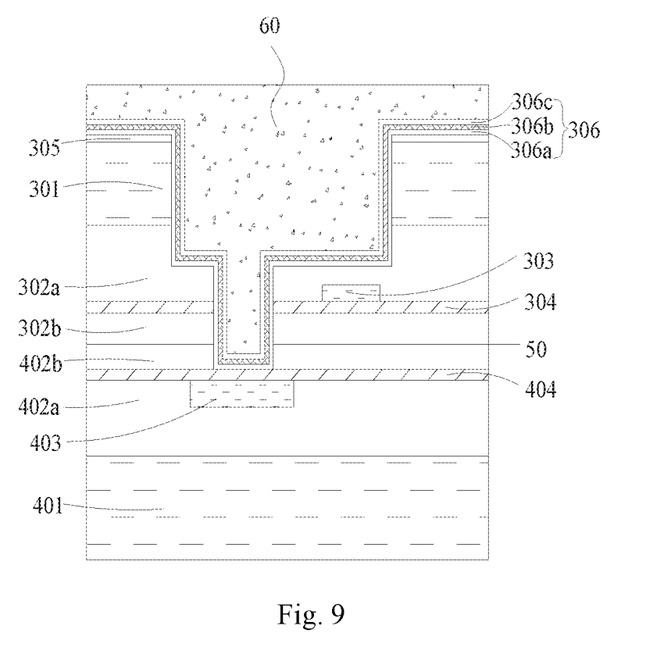
FIG. 9 is a schematic cross-sectional view after a filling layer is formed according to an embodiment of the present invention.

Next, as shown in FIG. 9, a filling layer 60 is formed, wherein the first opening 51 and the second opening 52 are filled with the filling layer 60, and the filling layer 60 covers the surface of the isolation layer 306. The filling layer 60 is a BARC (Bottom Anti Reflective Coating) with good fluidity.

Figure 10:
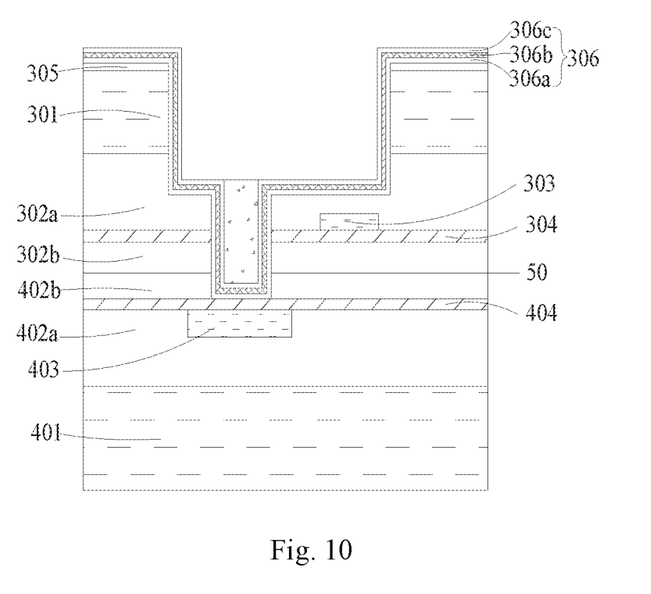
FIG. 10 is a schematic cross-sectional view after a filling layer is etched back according to an embodiment of the present invention.

Next, as shown in FIG. 10, the BARC on the surface of the isolation layer 306 and in the first opening 51 is removed by back etching. The remaining BARC top surface is flush with the surface of the second silicon oxide layer 306c at the bottom of the first opening 51.

Figure 11:
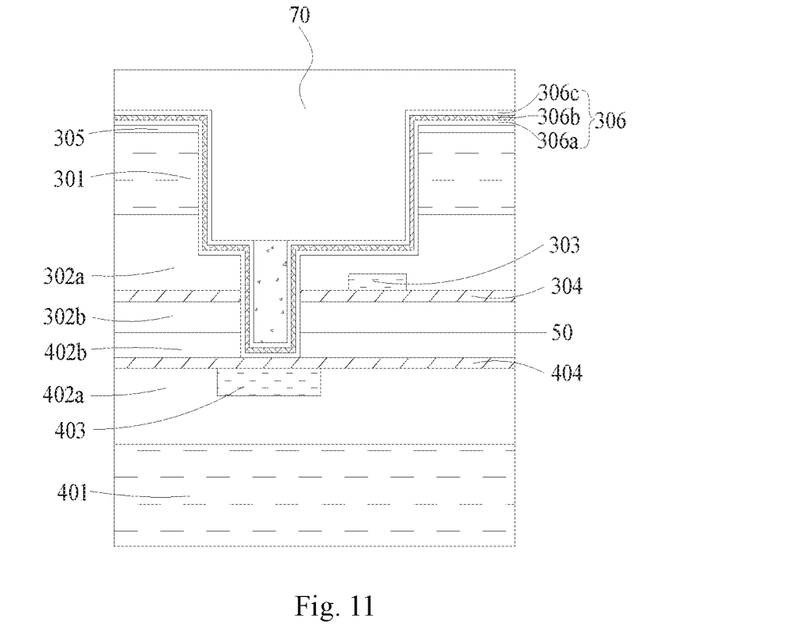
FIG. 11 is a schematic cross-sectional view after coating is performed with a photoresist according to an embodiment of the present invention.

Next, as shown in FIG. 11, the first opening 51 is coated with a photoresist. The photoresist 70 further covers the top surface of the isolation layer 306.

Figure 12:
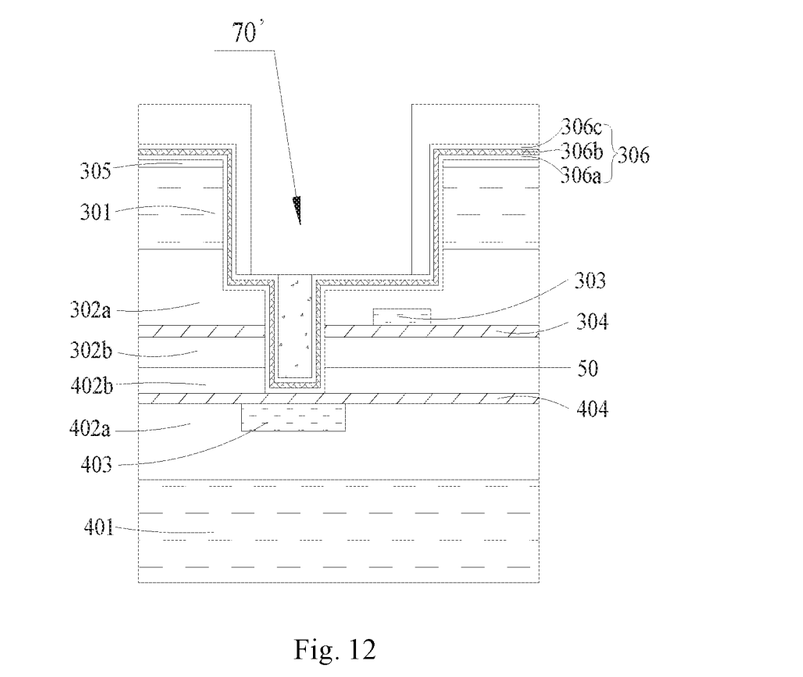
FIG. 12 is a schematic cross-sectional view after the photoresist is patterned according to an embodiment of the present invention.

Next, as shown in FIG. 12, a patterned photoresist 70 is formed. The patterned photoresist 70 covers the top surface of the isolation layer 306 and the isolation layer 306 on a sidewall of the first opening 51. The patterned photoresist 70 has a photoresist opening 70', and a cross section width of the photoresist opening 70' is greater than a cross section width of the second opening 52 and smaller than a cross section width of the first opening 51.

Figure 13:
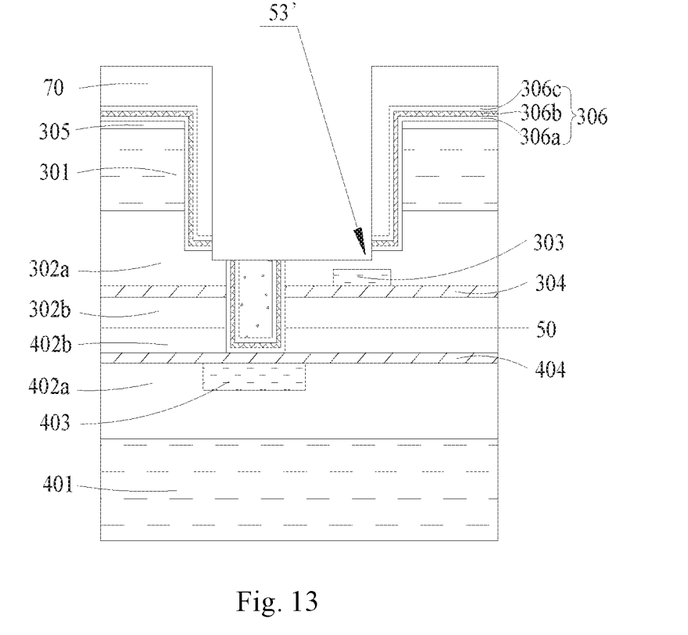
FIG. 13 is a schematic cross-sectional view after a third shallow trench is formed according to an embodiment of the present invention.

Next, as shown in FIG. 13, a third shallow trench 53' is formed. By using the patterned photoresist 70 as a mask, an etching process is performed to etch away the isolation layer 306 exposed by the photoresist opening 70' above the first metal layer 303 and the first dielectric layer 302 in parts of thickness therebelow to form the third shallow trench 53'.

Figure 14:
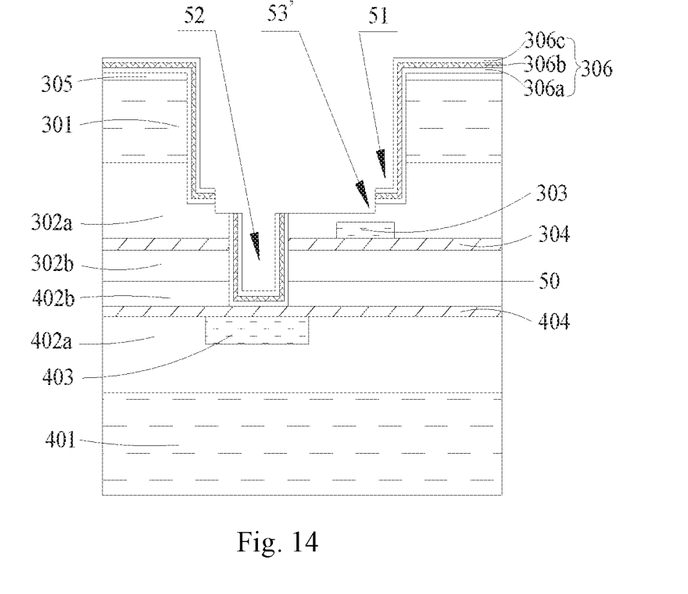
FIG. 14 is a schematic cross-sectional view after the photoresist and the filling layer are removed according to an embodiment of the present invention.

Next, as shown in FIG. 14, the portions of the photoresist 70 and the BARC in the second opening 52 are removed.

Next, as shown in FIG. 15, a dry etching process is performed to expose the first metal layer 303 and the second metal layer 403. The isolation layer 306 above the passivation layer 305 and at the bottom of the first opening 51 is removed, and the first dielectric layer first portion 302a exposed by the third shallow trench 53' above the first metal layer 303 is removed to expose a portion of the first metal layer 303 and also form a third opening 53. The isolation layer 306 at the bottom of the second opening 52 and the second etching stopping layer 204 directly therebelow are removed to expose a portion of the second metal layer 403. This step forms a TSV nested hole structure composed of the first opening 51, the second opening 52 and the third opening 53.

Figure 16:
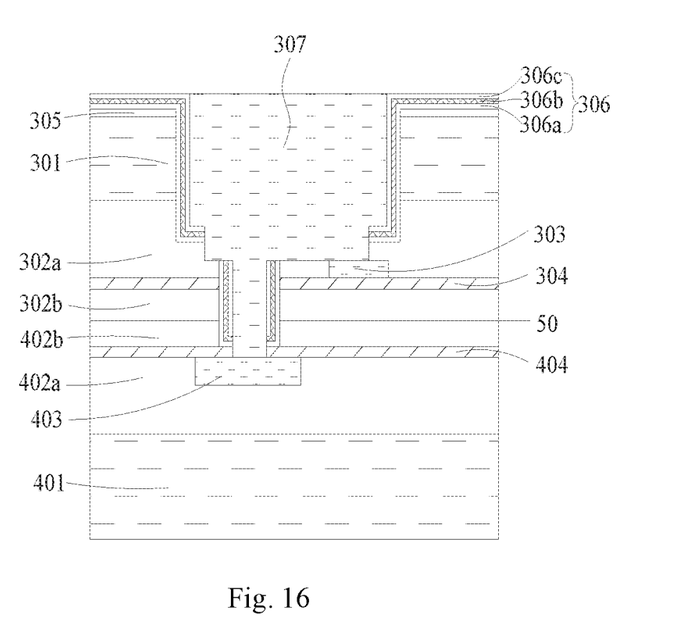
FIG. 16 is a schematic cross-sectional view after an interconnection layer is formed according to an embodiment of the present invention.

Next, as shown in FIG. 16, an interconnection layer 307 is formed. The first opening 51, the second opening 52 and the third opening 53 are filled with the interconnection layer 307. The interconnection layer 307 is electrically connected to the first metal layer 303 and the second metal layer 403, and the interconnection layer 307 further covers the surface of the isolation layer 306. Thereafter, a chemical mechanical polishing process is performed to remove the interconnection layer 307 on the surface of the isolation layer 306 and to planarize the interconnection layer 307 in the first opening 51.

The interconnection layer 307 is a conductive material, which may be copper or a copper alloy, and may be formed by filling by an electroplating process.

The isolation layer 306 in the present invention functions to prevent the first metal layer 303 and the second metal layer 403 (the material is, for example, copper) that are over-etched and back-splashed from diffusing to the first substrate 301 in the process of dry etching to expose the first metal layer 303 and the second metal layer 403. The isolation layer 306 also functions as a barrier layer to prevent the interconnection layer 307 (the material is, for example, copper) from diffusing into the first substrate 301.

The thickness of the silicon nitride layer 306b in the isolation layer 306 can be determined according to the filling amount of the interconnection layer 307 (the material is, for example, copper) and the controllability of the dry etching process.

Finally, with continued reference to FIG. 3, a lead-out layer 309 is formed. The lead-out layer 309 is electrically connected to the interconnection layer 307. In a specific implementation, the step of forming the lead-out layer 309 includes: first, an insulating layer 308 is formed, wherein the insulating layer 308 is located on the surfaces of the isolation layer 306 and the interconnection layer 307; next, a connection hole is formed, wherein the connection hole penetrates through the insulating layer 308 and is located above the interconnection layer 307; and then, the lead-out layer 309 is formed, wherein the lead-out layer 309 is electrically connected to the interconnection layer 307 via the connection hole. The lead-out layer 309 may be an aluminum layer, which is formed by depositing aluminum on the whole surface of the insulating layer 308 and then performing back etching. Finally, the semiconductor device as shown in FIG. 3 is finally formed.

In FIG. 5 to FIG. 16, after the first opening 51 and the second opening 52 are formed, the isolation layer 306 is formed, so that the isolation layer 306 covers the side surfaces of the first opening 51 and the second opening 52 at the same time, and the side surfaces can be protected more effectively. However, it should be understood that the isolation layer 306 may also be formed after the first opening 51 is formed.

Specifically, as shown in FIG. 6, after the first opening 51 is formed, another embodiment method is described in detail with reference to FIG. 17, FIG. 18 and FIG. 2.

Figure 17:
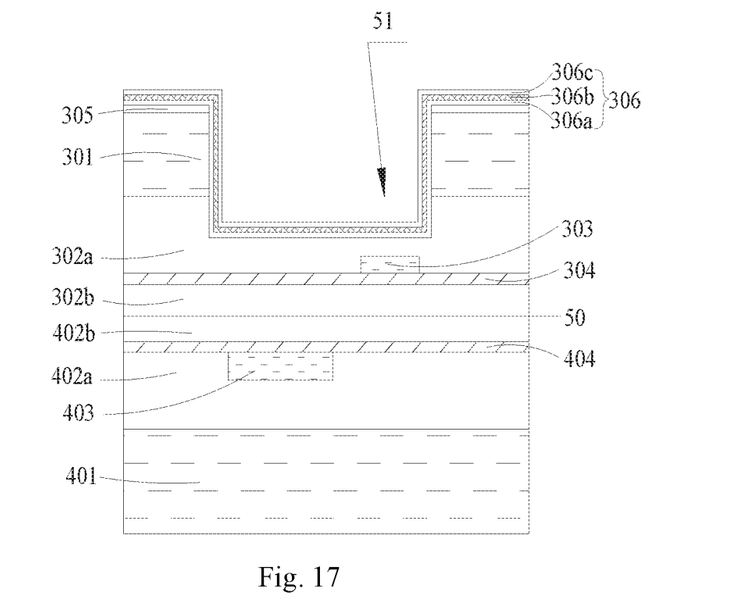
FIG. 17 is a schematic cross-sectional view after an isolation layer is formed after the first opening is formed according to another embodiment of the present invention.

As shown in FIG. 17, the isolation layer 306 is formed. First, a first silicon oxide layer 306a is formed, wherein the first silicon oxide layer 306a covers the surface of the passivation layer 305 and the surface of the first opening 51. Next, a silicon nitride layer 306b is formed, wherein the silicon nitride layer 306b covers the surface of the first silicon oxide layer 306a. Finally, a second silicon oxide layer 306c is formed, wherein the second silicon oxide layer 306c covers the surface of the silicon nitride layer 306b. The first silicon oxide layer 306a, the silicon nitride layer 306b and the second silicon oxide layer 306c constitute the isolation layer 306.

Figure 18:
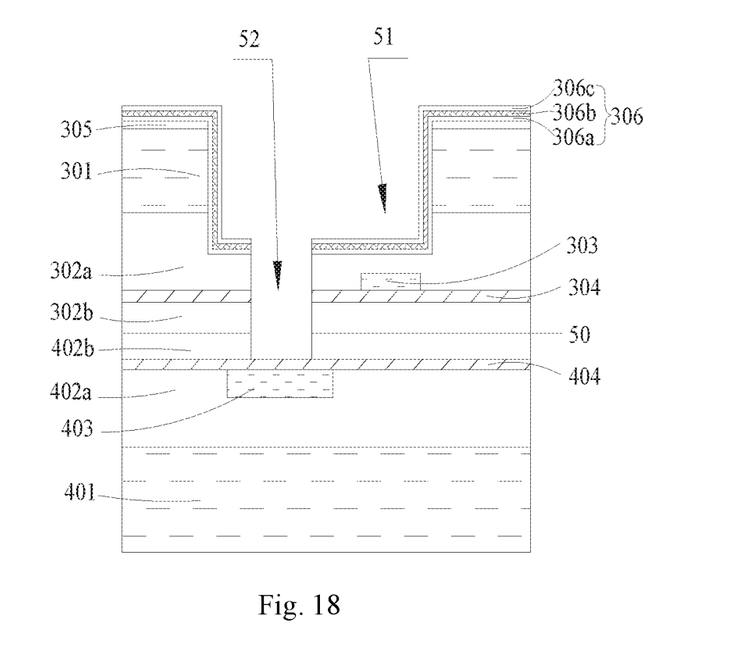
FIG. 18 is a schematic cross-sectional view after a second opening is formed according to another embodiment of the present invention.

Next, as shown in FIG. 18, a second opening 52 is formed. The etching process terminates at the second etching stopping layer 404 to form a second opening 52. The second opening 52 is located above the second metal layer 403, and the second opening 52 penetrates through the isolation layer 306 at the bottom of a portion of the first opening 51 and the first dielectric layer 302 and the second dielectric layer second portion 402b therebelow.

Next, the manufacturing method of the semiconductor device is similar to that described in FIG. 9 to FIG. 16, and finally the semiconductor device as shown in FIG. 2 is formed.

In summary, on the one hand, in the process of dry etching to expose the first metal layer 303 and the second metal layer 403, the isolation layer 306 prevents the first metal layer 303 and the second metal layer 403 which are over-etched and back-splashed from diffusing to the first substrate 301. On the other hand, the isolation layer 306 serves as a barrier layer to prevent the interconnection layer 307 from diffusing into the first substrate 301, thereby effectively protecting the wafer.

The various embodiments in the present specification are described in a progressive manner, and each embodiment focuses on differences from other embodiments, and the same or similar parts between the various embodiments may be referred to each other. For the device disclosed in the embodiment, since it corresponds to the method disclosed in the embodiment, the description is relatively simple, and the relevant parts can be referred to the description of the method.

The above description is only for the description of the preferred embodiments of the present invention, and is not intended to limit the scope of the present invention. Any changes and modifications made by those skilled in the art in light of the above disclosure are all within the scope of the appended claims.

What is claimed is:

1. A semiconductor device, comprising:
a first wafer and a second wafer, wherein the first wafer comprises a first substrate, a first dielectric layer located on a front surface of the first substrate and a first metal layer embedded in the first dielectric layer, the second wafer comprises a second substrate, a second dielectric layer located on a front surface of the second substrate and a second metal layer embedded in the second dielectric layer, and the first dielectric layer and the second dielectric layer being bonded to each other;

a first opening, wherein the first opening penetrates through the first substrate and a portion of the first dielectric layer, and the first opening located above the first metal layer;
a second opening, wherein the second opening penetrates through a portion of the second dielectric layer and is located above the second metal layer, and the second opening communicating with the first opening;
an isolation layer, wherein the isolation layer covers an entire side surface of the first opening;
a third opening, wherein the third opening is located between the first opening and the second opening and communicates with the first opening and the second opening, the third opening having a cross section width greater than a cross section width of the second opening and smaller than a cross section width of the first opening, and the third opening exposing the first metal layer;
an interconnection layer, wherein the interconnection layer is electrically connected to the first metal layer and the second metal layer via the first opening, the second opening and the third opening; and
a lead-out layer, wherein the lead-out layer is electrically connected to the interconnection layer.

2. The semiconductor device according to claim 1, wherein the isolation layer further comprises a first silicon oxide layer, the first silicon oxide layer covering at least a side surface of the first opening.

3. The semiconductor device according to claim 2, wherein the isolation layer further comprises a silicon nitride layer, the silicon nitride layer covering the first silicon oxide layer.

4. The semiconductor device according to claim 3, wherein the isolation layer further comprises a second silicon oxide layer, the second silicon oxide layer covering the silicon nitride layer.

5. The semiconductor device according to claim 1, wherein the first metal layer and the second metal layer are made of copper or a copper alloy.

6. The semiconductor device according to claim 1, wherein the isolation layer further covers a side surface of the second opening.

7. The semiconductor device according to claim 1, wherein the isolation layer further covers a back surface of the first substrate.

8. The semiconductor device according to claim 7, wherein the back surface of the first substrate is further provided with a passivation layer, and the isolation layer further covering the passivation layer.

9. The semiconductor device according to claim 1, wherein the first dielectric layer includes a first dielectric layer first portion and a first dielectric layer second portion.

10. The semiconductor device according to claim 1, wherein the second dielectric layer includes a second dielectric layer first portion and a second dielectric layer second portion.

11. A manufacturing method of the semiconductor device, comprising:
providing a first wafer and a second wafer, wherein the first wafer comprises a first substrate, a first dielectric layer located on a front surface of the first substrate and a first metal layer embedded in the first dielectric layer, the second wafer comprises a second substrate, a second dielectric layer located on the second substrate and a second metal layer embedded in the second dielectric layer, and the first dielectric layer and the second dielectric layer being bonded to each other;

forming a first opening and a second opening, wherein the first opening penetrates through the first substrate and a portion of the first dielectric layer and is located above the first metal layer; the second opening penetrates through a portion of the second dielectric layer and is located above the second metal layer, and the second opening communicating with the first opening;

performing a dry etching process to expose the first metal layer and the second metal layer and form a third opening, wherein the third opening is located between the first opening and the second opening and communicates with the first opening and the second opening, the third opening having a cross section width greater than a cross section width of the second opening and smaller than a cross section width of the first opening, and the third opening exposing the first metal layer;

forming an interconnection layer, wherein the interconnection layer is electrically connected to the first metal layer and the second metal layer via the first opening, the second opening and the third opening; and forming a lead-out layer, wherein the lead-out layer is electrically connected to the interconnection layer;

the manufacturing method further comprises:

forming an isolation layer before performing the dry etching process, the isolation layer covering at entire side surface of the first opening, and removing a portion of the isolation layer at a bottom surface of the first opening when the dry etching process is performed.

12. The manufacturing method of the semiconductor device according to claim 11, wherein the isolation layer is formed after the first opening is formed.

13. The manufacturing method of the semiconductor device according to claim 11, wherein the isolation layer is formed after the second opening is formed, the isolation layer further covering a surface of the second opening, and the dry etching process is performed to etch a portion of the isolation layer at the bottom surface of the first opening and a portion of the first dielectric layer below the bottom surface of the first opening and to etch a portion of the isolation layer at a bottom surface of the second opening and a portion of the second dielectric layer below the bottom surface of the second opening.

14. The manufacturing method of the semiconductor device according to claim 11, wherein performing the dry etching process comprises:

forming a filling layer, wherein the second opening is filled with the filling layer;

forming a patterned photoresist, wherein the patterned photoresist covers a back surface of the first substrate and a portion of the isolation layer on a sidewall of the first opening, the patterned photoresist having a photoresist opening, and the photoresist opening having a cross section width greater than a cross section width of the second opening and smaller than a cross section width of the first opening;

etching away a portion of the isolation layer exposed by the photoresist opening above the first metal layer and a portion of the first dielectric layer below the portion of the isolation layer exposed by the photoresist opening above the first metal layer to form a third shallow trench;

removing the filling layer and the patterned photoresist; and performing dry etching to remove a portion of the first dielectric layer exposed by the third shallow trench above the first metal layer so as to form the third opening while exposing a portion of the first metal layer, and removing a portion of the isolation layer at a bottom surface of the second opening and a portion of the second dielectric layer below the portion of the isolation layer at the bottom surface of the second opening to expose a portion of the second metal layer.

15. The manufacturing method of the semiconductor device according to claim 11, wherein the isolation layer further comprises a first silicon oxide layer, the first silicon oxide layer covering at least a side surface of the first opening.

16. The manufacturing method of the semiconductor device according to claim 15, wherein the isolation layer further comprises a silicon nitride layer, the silicon nitride layer covering the first silicon oxide layer.

17. The manufacturing method of the semiconductor device according to claim 16, wherein the isolation layer further comprises a second silicon oxide layer, the second silicon oxide layer covering the silicon nitride layer.

18. The manufacturing method of the semiconductor device according to claim 11, wherein the first metal layer and the second metal layer are made of copper or a copper alloy.

19. The manufacturing method of the semiconductor device according to claim 11, wherein the back surface of the first substrate is further provided with a passivation layer, and the isolation layer further covering the passivation layer.

20. The manufacturing method of the semiconductor device according to claim 11, wherein the first dielectric layer includes a first dielectric layer first portion and a first dielectric layer second portion, and wherein the second dielectric layer includes a second dielectric layer first portion and a second dielectric layer second portion.

* * * * *